(12) United States Patent
Sarin et al.

(10) Patent No.: US 8,295,109 B2
(45) Date of Patent: *Oct. 23, 2012

(54) REPLACING DEFECTIVE COLUMNS OF MEMORY CELLS IN RESPONSE TO EXTERNAL ADDRESSES

(75) Inventors: Vishal Sarin, Cupertino, CA (US); William H. Radke, Los Gatos, CA (US); Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 59 days.

This patent is subject to a terminal disclaimer.

(21) Appl. No.: 13/017,168

(22) Filed: Jan. 31, 2011

(65) Prior Publication Data

US 2011/0122717 A1    May 26, 2011

Related U.S. Application Data

(63) Continuation of application No. 12/272,138, filed on Nov. 17, 2008, now Pat. No. 7,881,134.

(51) Int. Cl.
*G11C 29/00* (2006.01)
(52) U.S. Cl. .................................. 365/200; 365/201
(58) Field of Classification Search .............. 365/239
See application file for complete search history.

(56) References Cited

U.S. PATENT DOCUMENTS

| | | | |
|---|---|---|---|
| 5,163,023 A * | 11/1992 | Ferris et al. | 365/200 |
| 5,274,593 A * | 12/1993 | Proebsting | 365/200 |
| 5,357,473 A * | 10/1994 | Mizuno et al. | 365/201 |
| 5,430,678 A * | 7/1995 | Tomita et al. | 365/200 |
| 5,577,050 A * | 11/1996 | Bair et al. | 714/710 |
| 5,774,396 A | 6/1998 | Lee et al. | |
| 5,808,945 A | 9/1998 | Arase | |
| 5,848,021 A | 12/1998 | Sugibayashi | |
| 6,005,813 A | 12/1999 | Waller et al. | |

(Continued)

FOREIGN PATENT DOCUMENTS

KR    10-0536491    12/2005

OTHER PUBLICATIONS

Non-Final Office Action dated Jun. 24, 2010 in U.S. Appl. No. 12/274,426 (9 pgs.).

*Primary Examiner* — Tan T. Nguyen
(74) *Attorney, Agent, or Firm* — Leffert Jay & Polglaze, P.A.

(57) ABSTRACT

Controllers and memory devices are provided. In an embodiment, a controller is configured to address a non-defective column of memory cells of a memory device in place of a defective column of memory cells of the memory device in response to receiving an address of the defective column of memory cells from the memory device. In another embodiment, a memory device has columns of memory cells and is configured to receive an external address that addresses a non-defective column of memory cells of a sequence of columns of memory cells of the memory device in place of a defective column of memory cells of the sequence of columns of memory cells such that the non-defective column replaces the defective column. The non-defective column is a proximate non-defective column following the defective column in the sequence of columns that is available to replace the defective column.

20 Claims, 3 Drawing Sheets

U.S. PATENT DOCUMENTS

| | | |
|---|---|---|
| 6,091,650 A | 7/2000 | Ferrant |
| 6,115,301 A | 9/2000 | Namekawa |
| 6,178,127 B1 * | 1/2001 | Haraguchi .................... 365/200 |
| 6,233,181 B1 | 5/2001 | Hidaka |
| 6,304,502 B1 * | 10/2001 | Watanabe et al. ............. 365/201 |
| 6,307,794 B1 | 10/2001 | Haga |
| 6,577,534 B2 | 6/2003 | Tsuruda |
| 6,584,022 B2 | 6/2003 | Tsuji |
| 6,625,071 B2 | 9/2003 | Ikeda et al. |
| 6,732,229 B1 | 5/2004 | Leung et al. |
| 7,447,066 B2 | 11/2008 | Conley et al. |
| 7,505,319 B2 | 3/2009 | Wu et al. |
| 2001/0038554 A1 | 11/2001 | Takata et al. |
| 2004/0233720 A1 | 11/2004 | Imamiya et al. |

* cited by examiner

REPLACING DEFECTIVE COLUMNS OF MEMORY CELLS IN RESPONSE TO EXTERNAL ADDRESSES

RELATED APPLICATION

This application is a continuation of U.S. application Ser. No. 12/272,138, titled "REPLACING DEFECTIVE COLUMNS OF MEMORY CELLS IN RESPONSE TO EXTERNAL ADDRESSES," filed Nov. 17, 2008 and issued as U.S. Pat. No. 7,881,134 on Feb. 1, 2011, which is commonly assigned and incorporated herein by reference.

FIELD

The present disclosure relates generally to memory devices and in particular the present disclosure relates to replacing defective columns of memory cells in response to external addresses.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as trapping layers or other physical phenomena (which is sometimes referred to as writing), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a data line, such as column bit line.

The memory array is accessed by a row decoder activating a row of memory cells by selecting the word line connected to (and, in some cases, formed by) a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

A memory device is usually placed in communication with a controller, such as a processor, a host controller, or other external host device via an input/output interface, e.g., to form part of an electronic system. The memory device receives control signals, command signals (which are sometimes referred to as commands), address signals (which are sometimes referred to as addresses), and data signals (which are sometimes referred to as data) from the controller and outputs data to the controller.

Defects can occur during the manufacture of a memory array having rows and columns of memory cells, resulting in defective rows or columns. This problem is commonly solved by incorporating redundant elements in the memory device that selectively replace defective elements. Redundant columns are a common form of redundant elements used in flash memory to replace defective primary columns.

Redundant columns are typically located in a different portion of a memory array than the primary columns. Generally, redundancy circuitry is used to selectively route access requests directed to the defective primary columns to the redundant columns located in a different portion of the array. Some memory devices, including some flash memory devices, utilize non-volatile registers to store addresses of primary columns that are designated to be replaced. Address requests from the host controller are compared to the addresses of the defective primary columns stored in the registers at the memory device, e.g., by the redundancy circuitry. If an address request matches an address of a defective primary column stored in the register, the redundancy circuitry directs (referred in the art as "maps") the access request to the redundant column instead of the defective primary column.

The process of replacing a defective primary column with a redundant column is typically transparent to the host controller in that a host controller does not know the address it sends to the memory device is an address of a defective column. That is, the host controller believes it is accessing a column at a location in the memory array (the location of the defective column) corresponding to the address that the host controller sends to the memory device. Instead, the host controller is accessing a redundant column located at a different location within the array.

During programming, the temperature of the memory cells can vary according to their location within the memory array, such as along the length of a word line when a voltage is applied to the word line. For example, the temperature of a memory cell at one end of the word line may be different than the temperature of a memory cell at the other end of the word line. Such a temperature variation may produce a voltage variation along the length of a word line, e.g., about 200 mV.

Reference cells are sometimes located at certain locations within the array to compensate for the temperature effect on memory cells that are proximate the reference memory cells. For example, the host controller may be programmed to compensate for the effect of temperature on the voltage received at a group of memory cells, according to the effect of temperature on the reference memory cell proximate that group of memory cells.

Problems can occur when there is a defective column whose memory cells are being compensated for by one or more reference cells proximate to those memory cells and whose address is mapped to a redundant column located at a different location in the array, where the temperature may be considerably different than the temperature of the reference memory cell. However, the host controller is programmed to compensate for the temperature effect based on the reference cell proximate the defective column and not the redundant column, where the temperature compensation based on the reference memory cell proximate the defective column may not be applicable for the redundant column. That is, the temperature compensation will be applied to the memory cells of the redundant column as though they were located at the location of the defective column.

For the reasons stated above, and for other reasons stated below which will become apparent to those skilled in the art upon reading and understanding the present specification, there is a need in the art for alternative redundancy schemes.

DETAILED DESCRIPTION

Figure 1:
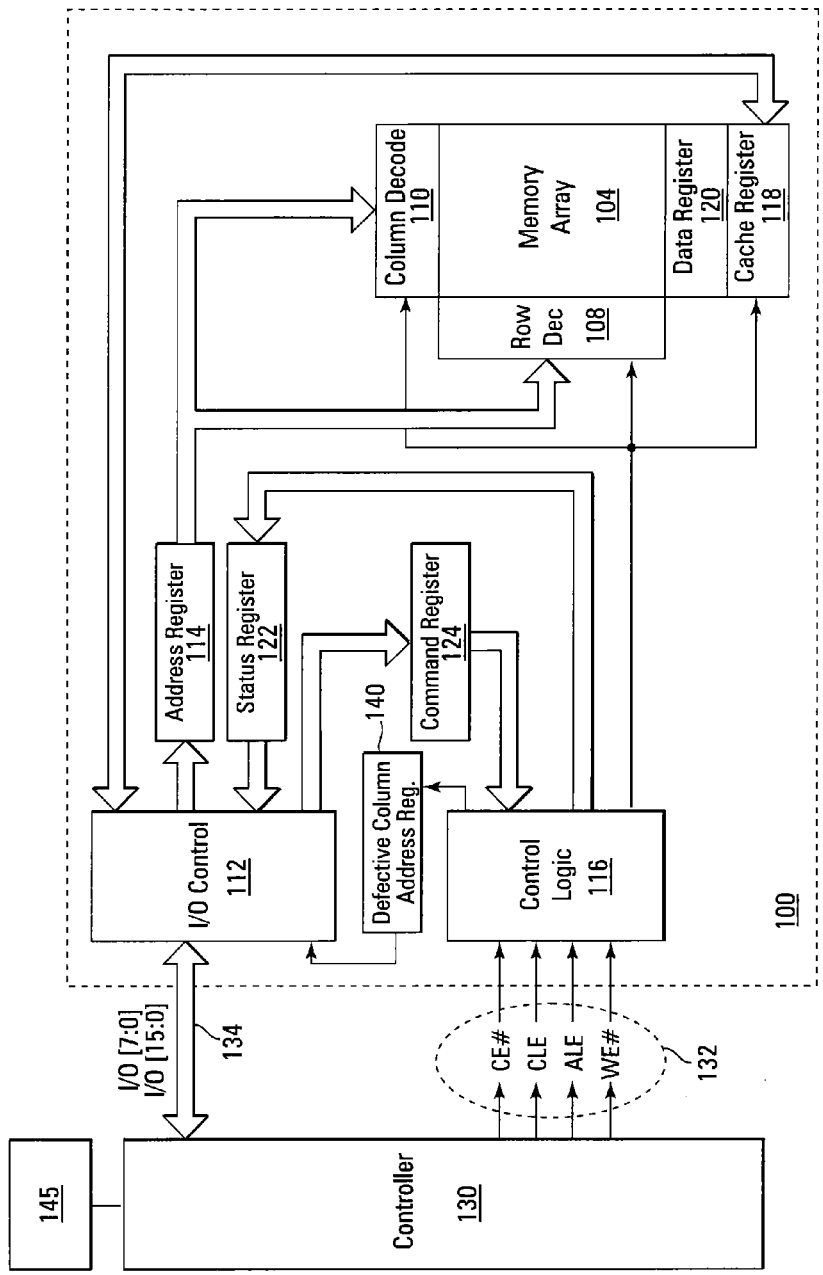
FIG. 1 is a simplified block diagram of an embodiment of an electronic system, according to an embodiment of the disclosure.

In the following detailed description, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

FIG. 1 is a simplified block diagram of a NAND flash memory device 100 coupled to a controller 130 as part of an electronic system, such as a personal digital assistant (PDA), digital camera, digital media player, cellular telephone, etc., according to an embodiment. The controller 130 may be a processor, memory controller, or other external host device. Memory device 100 includes an array of memory cells 104 organized in rows and columns. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the controller 130. The control logic 116 is coupled to row decoder 108 and column decoder 110 to control the row decoder 108 and column decoder 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the controller 130; then new data is passed from the data register 120 to the cache register 118. A status register 122 is coupled between I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which are sometimes referred to as commands), address signals (which are sometimes referred to as addresses), and data signals (which are sometimes referred to as data) from controller 130 over a multiplexed input/output (I/O) link 134 (which is sometimes referred to as an I/O bus) and outputs data to controller 130 over I/O link 134.

Specifically, the commands are received over input/output (I/O) pins [7:0] of I/O link 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

For one embodiment, a defective column address register 140 is coupled between I/O control circuitry 112 and control logic 116. Defective column address register 140 is configured to store the addresses of one or more defective columns of memory cells of memory array 104. During operation, defective column address register 140 latches the addresses of the one or more defective columns, e.g., at least partially in response to receiving a signal from control logic 116, to I/O control circuitry 112 for subsequent output to controller 130 over input/output (I/O) link 134. For one embodiment, the addresses of the one or more defective columns are output to controller 130 at least partially in response to memory device 100 powering up. For another embodiment, control logic 116 sends a signal to defective column address register 140 when control logic 116 determines that memory device is powered up.

It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

Figure 2:
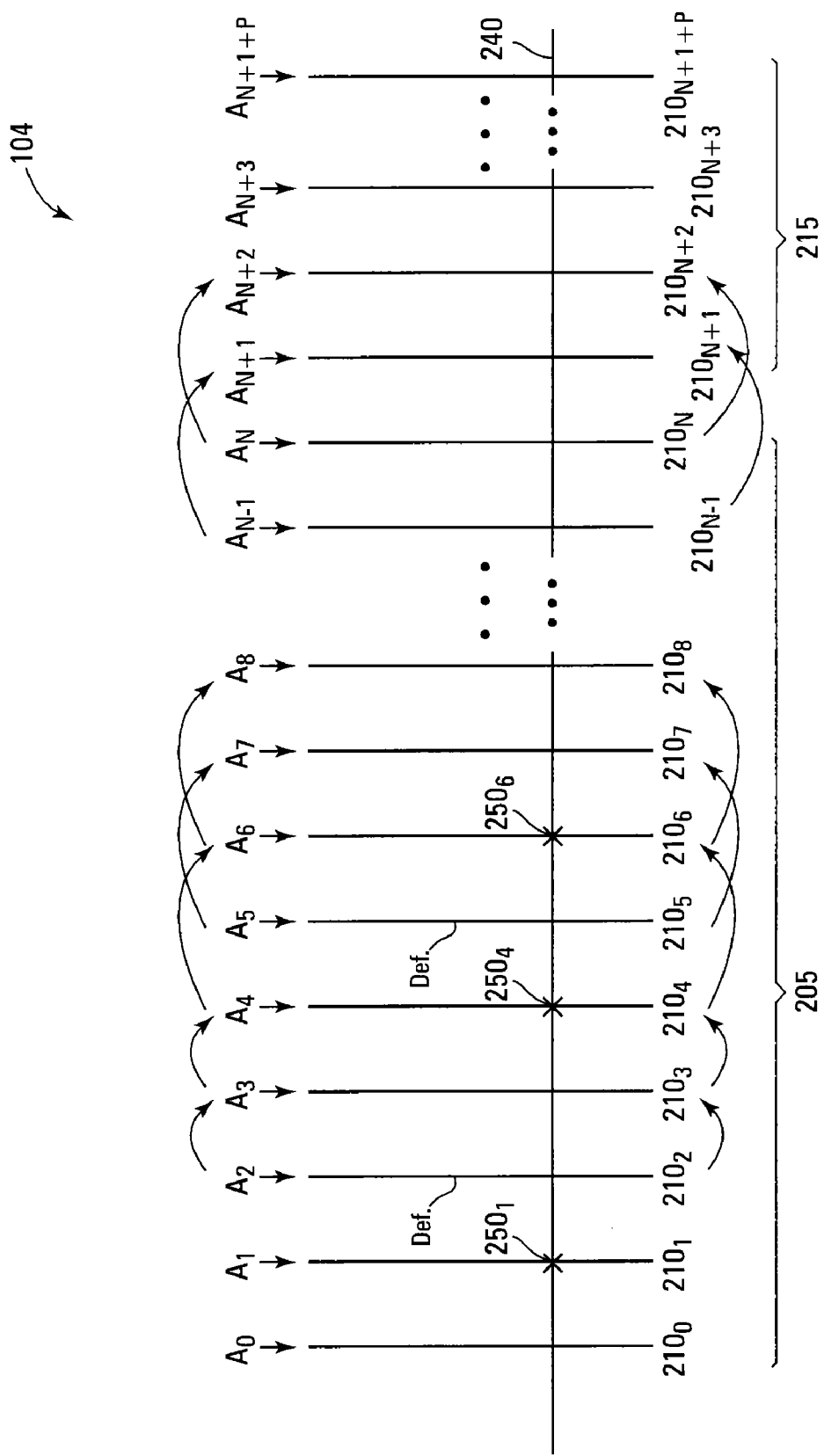
FIG. 2 illustrates an embodiment of a memory array, according to another embodiment of the disclosure.

FIG. 2 illustrates memory array 104, according to an embodiment. Memory array 104 includes a primary memory array 205 with sequential primary columns $210_0$ to $210_N$ and an additional (e.g., a redundant) array 215 with additional (e.g., redundant) sequential columns $210_{N+1}$ to $210_{N+1+P}$, where the additional columns are used only when one or more of the primary columns are defective. Primary columns $210_1$ to $210_N$ respectively have sequential column addresses $A_0$ to $A_N$, and additional sequential columns $210_{N+1}$ to $210_{N+1+P}$ respectively have sequential column addresses $A_{N+1}$ to $A_{N+1+P}$.

The physical distances of columns $210_0$ to $210_{N+1+P}$ from a reference location within the memory array, such as column $210_0$ at one end of the array, sequentially increase as their respective addresses $A_0$ to $A_{N+1+P}$ sequentially increase from address $A_0$. For example, the larger the column address, the larger the distance of the column from column $210_0$. For example, since address $A_3$ is larger than address $A_2$, column $210_3$ is at a greater distance from column $210_0$ than column $210_2$. In other words, the addresses $A_0$ to $A_{N+1+P}$ respectively specify the sequential order of columns $210_0$ to $210_{N+1+P}$ within the memory array, starting with address $A_0$ of column $210_0$.

In the event that one or more of primary columns 210 are determined to be defective, the addresses of the defective columns can be stored in defective column address register 140 (FIG. 1). For example, addresses $A_2$ and $A_5$ are stored in defective column address register 140 (e.g., during the manufacture of memory device 100) when primary columns $210_2$ and $210_5$, respectively having addresses $A_2$ and $A_5$, are determined to be defective, such as during testing, e.g., during the manufacture of memory device 100. Addresses $A_2$ and $A_5$ of defective primary columns $210_2$ to $210_5$ are then sent to controller 130 via input/output (I/O) control circuitry 112 and input/output (I/O) link 134, e.g., upon power up of memory device 100. For one embodiment, controller 130 may store the addresses of the defective columns in a volatile memory (e.g., a volatile register) 145, for example, that may be removably coupled to controller 130.

Controller 130 may be configured to compare addresses of columns 210 to the addresses of the defective columns stored in volatile memory 145. For example, controller 130 may compare an address to be sent to memory device 100, to the addresses of the defective columns stored in volatile memory 145. Controller 130 may be further configured to replace the address to be sent to memory device 100 with the address of a proximate, e.g., the first, non-defective column in the column sequence following a defective column that is available to replace the defective column, e.g., that has not been used previously as a replacement column, when the address to be sent to the memory controller matches the address of that defective column. Controller 130 may be also configured to replace each of the addresses, to be sent to memory device 100, of non-defective columns succeeding the address of the defective column with the address of the next available non-defective column following that non-defective column in the column sequence. Controller may keep track of the addresses it has replaced so that it does not try to use an address that is already been used as a replacement.

For one embodiment, when controller 130 encounters an address of a defective column, controller 130 increments the address to the address of a proximate non-defective column of memory cells following the defective column of memory cells in the sequence of columns of memory cells. For example, when controller 130 encounters address $A_2$ of defective column $210_2$, controller 130 increments the address $A_2$ by one address to address $A_3$ of non-defective column $210_3$, the first available non-defective column in the column sequence following defective column $210_2$, as shown in FIG. 2, and the succeeding address $A_3$ by one address to address $A_4$, the address of the next non-defective column $210_4$ in the column sequence available for replacement, e.g., that has not been used previously as a replacement column. Since address $A_5$ is the address of a defective column $210_5$, address $A_4$ is incremented by two addresses to address $A_6$ of non-defective column $210_6$, the next available non-defective column in the column sequence following defective column $210_5$, e.g., that has not been used previously as a replacement column. Address $A_5$ is incremented by two addresses to address $A_7$, the address of the next available non-defective column $210_7$ in the column sequence following defective column $210_5$, e.g., that has not been used previously as a replacement column, (note, column $210_6$ is not the next available non-defective column of the column sequence in that it replaces column $210_4$). Incrementing the addresses continues until address $A_{N-1}$ is incremented by two addresses to address $A_{N+1}$ of non-defective additional column $210_{N+1}$, and address $A_N$ is incremented by two addresses to address $A_{N+2}$ of non-defective additional column $210_{N+2}$. Note that the address space $A[0:N]$ of the primary array 205 is expanded to $A[0:N+2]$ to accommodate for defective columns $210_2$ and $210_5$. That is, the address space is shifted up by the number of addresses of defective columns.

After sequentially incrementing the addresses as described above, controller 130 sends the incremented addresses to memory device 100. An address incremented from an address of a defective column addresses a proximate, e.g., the first available, non-defective column in the column sequence following the defective column in place of the defective column so that the proximate non-defective column replaces the defective column. For example, after incrementing address $A_2$ of defective column $210_2$ to address $A_3$ of non-defective column $210_3$, address $A_3$ can be used to address non-defective column $210_3$ in place of defective column $210_2$, thus replacing defective column $210_2$ with non-defective column $210_3$. This means that controller 130 instructs memory device to access non-defective column $210_3$ in place of defective column $210_2$.

To accommodate for the column replacement, each of the non-defective columns sequentially following the defective column is replaced by the next available non-defective column in the column sequence. After incrementing address $A_3$ of non-defective column $210_3$ to address $A_4$ of non-defective column $210_4$, address $A_4$ can be used to address non-defective column $210_4$ in place of non-defective column $210_3$, thus replacing non-defective column $210_3$ with non-defective column $210_4$. Since column $210_5$ is defective, non-defective column $210_4$ is replaced by non-defective column $210_6$, the next available non-defective column in the column sequence, so that non-defective column $210_6$ can be accessed in place of non-defective column $210_4$. For example, after incrementing address $A_4$ of non-defective column $210_4$ to address $A_6$ of non-defective column $210_6$, address $A_6$ can be used to address non-defective column $210_6$ in place of non-defective column $210_4$, thus replacing non-defective column $210_4$ with non-defective column $210_6$. Similarly, defective column $210_5$ is replaced by non-defective column $210_7$, non-defective column $210_6$ by non-defective column $210_8$, and so on until non-defective column $210_N$ is replaced by non-defective additional column $210_{N+2}$.

Note that the scheme of replacing a defective column by the next available non-defective column in the column sequence following the defective column, e.g., in a direction away from a reference column in the memory array, such as the end column having the first address in the address sequence, differs from conventional redundancy schemes in that the replacement columns are closer to the defective columns they replace. For example, in a conventional redundancy scheme of the prior art, shown in FIG. 3, defective columns in primary array 305, e.g., defective columns $310_2$ and $310_5$, are respectively replaced by redundant columns $320_0$ and $320_1$ of redundant array 315 in response to a controller sending addresses $A'_2$ and $A'_5$ to memory device 100. However, defective columns $310_2$ and $310_5$ are further from their replacement columns $320_0$ and $320_1$ than defective columns $210_2$ and $210_5$ are from their replacement columns $210_3$ and $210_7$ (FIG. 2).

Note that for some memory devices, reference memory cells are located in selected columns. These reference memory cells are used by a controller, such as controller 130, to correct for the effect of temperature on the voltage delay along the access line (e.g., word line) to which these reference memory cells are connected. For example, the reference cells may be used to correct for the effect of temperature on the voltage delay at memory cells in columns that include the reference memory cells and in columns that do not include reference memory cells, but that are proximate to the columns with the reference memory cells.

For one embodiment, reference memory cells $250_1$ and $250_4$, respectively shown at intersections of columns $210_1$ and $210_4$ and an access line (e.g., a word line) 240 in FIG. 2, are used by controller 130 to correct for the effect of temperature on the voltage delay at reference memory cells $250_1$ and $250_4$ of columns $210_1$ and $210_4$ and at memory cells in columns that are proximate to columns $210_1$ and $210_4$, such as columns $210_2$ and $210_5$. However, columns $210_2$ and $210_5$ are indicated as being defective. Therefore, column $210_2$ is replaced by column $210_3$, the next available non-defective column of the column sequence, and column $210_5$ is replaced by column $210_7$, the next available non-defective column of the column sequence (note, column $210_6$ is not the next available non-defective column of the column sequence in that it replaces column $210_4$). After the replacement, during operation, controller 130 can correct for the effect of temperature on the voltage delay at memory cells in column $210_3$ and column $210_7$, e.g., by sending a signal to memory device 100 to apply the correction, as though the memory cells were respectively in defective columns $210_2$ and $210_5$, e.g., respectively using reference memory cells $250_1$ and $250_4$ of columns $210_1$ and $210_4$.

Figure 3:
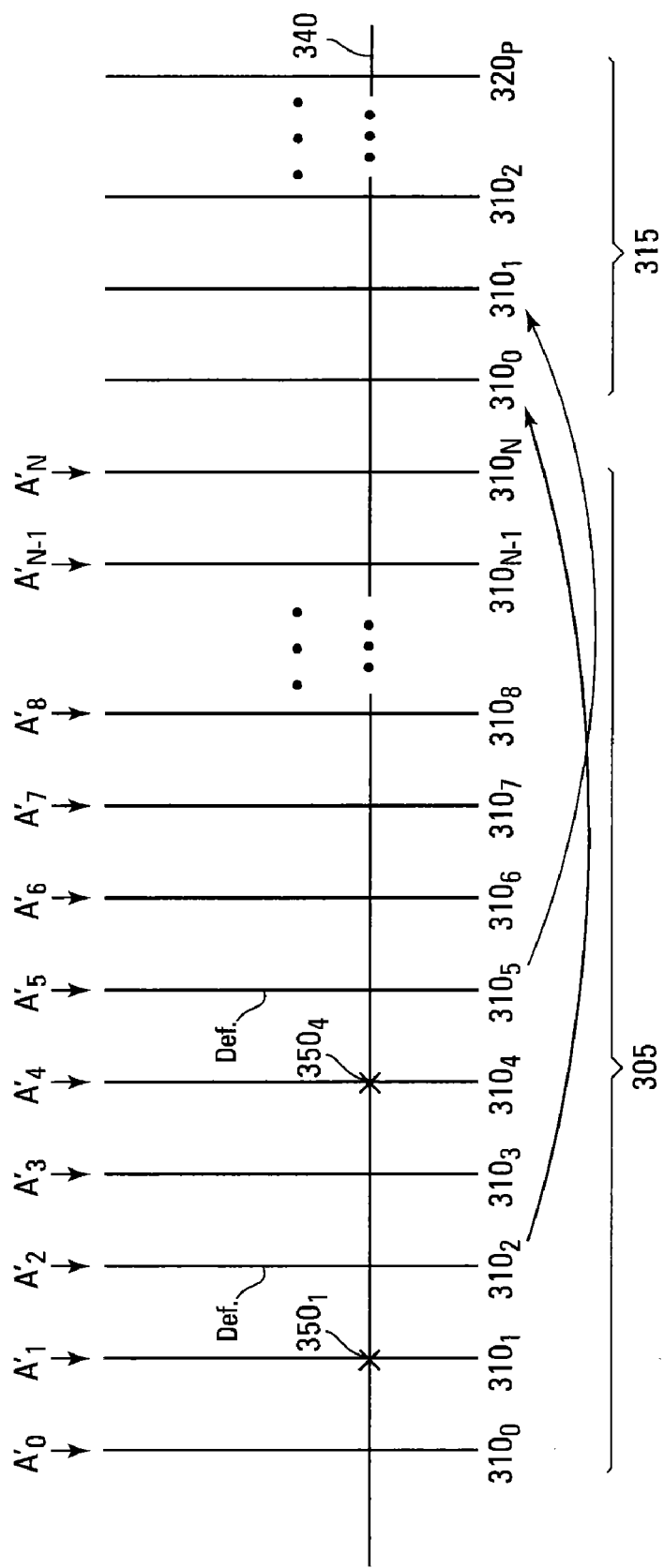
FIG. 3 illustrates a memory array of the prior art.

As for the prior art of FIG. 3, reference memory cells $350_1$ and $350_4$, respectively shown at intersections of columns $310_1$ and $310_4$ and an access line (e.g., a word line) 340, are used by a controller to correct for the effect of temperature on the voltage delay at reference memory cells $350_1$ and $350_4$ of columns $310_1$ and $310_4$ and at memory cells in columns that are proximate to columns $310_1$ and $310_4$, such as columns $310_2$ and $310_5$. However, columns $310_2$ and $310_5$ are indicated as being defective. Therefore, column $310_2$ is replaced by redundant column $320_0$, and column $310_4$ is replaced by redundant column $320_1$. After the replacement, during operation, the controller will correct for the effect of temperature on the voltage delay at memory cells in redundant column $320_0$ and redundant column $320_1$ as though the memory cells were respectively in defective columns $310_2$ and $310_5$, e.g., respectively using reference memory cells $350_1$ and $350_4$ of columns $310_1$ and $310_4$.

It is expected that the further a replacement column is from the defective column it replaces and thus a reference memory cell, the larger the error in the correction for the effect of temperature on the voltage delay applied to the replacement column. Since non-defective columns $210_3$ and $210_7$ are closer to defective columns $210_2$ and $210_5$ and thus respectively to reference memory cells $250_1$ and $250_4$ than redundant columns $320_0$ and $320_1$ are to defective columns $310_2$ and $310_5$ and thus respectively to reference memory cells $350_1$ and $350_4$, it is expected that the error in the correction for the effect of temperature on the voltage delay applied to non-defective columns $210_3$ and $210_7$ is less than the error in the correction for the effect of temperature on the voltage delay applied to redundant columns $320_0$ and $320_1$.

For another embodiment, one or more memory cells, such as memory cell $250_6$, of a non-defective replacement column, such as the non-defective replacement column $210_6$ that replaces defective column $210_4$, may be assigned as one or more reference cells, e.g., by controller 130 after the replacement. In such embodiments, a reference cell is used to make corrections to its non-defective replacement column and to non-defective columns proximate thereto, e.g. in response to controller 130 receiving a signal from memory device 100 indicative of the temperature at the reference cell, making the correction based on the temperature, and sending a signal to memory 100 instructing memory device to apply the correction to the non-defective replacement column and non-defective columns proximate thereto. For example, a temperature correction may be applied to non-defective replacement column $210_6$ and proximate non-defective column $210_7$ according to assigned reference cell $250_6$.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A controller configured to:
   address a non-defective column of memory cells of a memory device in place of a defective column of memory cells of the memory device in response to receiving an address of the defective column of memory cells from the memory device.

2. The controller of claim 1, wherein the non-defective column of memory cells is a first available non-defective column of memory cells within a sequence of columns of memory cells, and wherein the controller is configured to address a next available non-defective column of memory cells within the sequence of columns of memory cells in place of the first available non-defective column of memory cells.

3. The controller of claim 1, wherein the first available non-defective column of memory cells and the next available non-defective column of memory cells are in a primary memory array of the memory device, and wherein the controller is configured to address a non-defective column of memory cells in a redundant memory array of the memory device in place of the next available non-defective column of memory cells.

4. A controller configured to:
   receive an address of a defective column of memory cells of a memory device;
   replace the address of the defective column with an address of a non-defective column of memory cells of the memory device; and send the address of the non-defective column of memory cells to the memory device for addressing the non-defective column of memory cells in place of the defective column of memory cells.

5. The controller of claim 4, wherein the controller comprises a memory configured to store the address of the defective column.

6. The controller of claim 5, wherein the memory is configured to be removably coupled to the controller.

7. The controller of claim 5, wherein the memory is volatile memory.

8. The controller of claim 4, wherein the controller is configured keep track of the addresses it has replaced.

9. The controller of claim 4, wherein the controller is further configured to apply a voltage correction to the non-defective column of memory cells to compensate for an effect of temperature on a voltage, when that voltage is applied to at least one of the memory cells of the non-defective column of memory cells.

10. The controller of claim 4, wherein the controller is further configured to assign a memory cell of the non-defective column of memory cells as a reference memory cell.

11. A controller configured to:
receive an address of a defective column of memory cells of a memory device;
replace an address to be sent to the memory device with an address of a non-defective column of memory cells of the memory device when the address to be sent to the memory device matches the address of the defective column; and
send the address of the non-defective column of memory cells to the memory device for addressing the non-defective column of memory cells in place of the defective column of memory cells.

12. A controller configured to:
receive an address of a defective column of memory cells of a memory device;
when an address of a sequence of addresses to be sent to the memory device matches the address of the defective column, incrementing that address to an address of a non-defective column; and
send the address of the non-defective column of memory cells to the memory device for addressing the non-defective column of memory cells in place of the defective column of memory cells.

13. A memory device, comprising:
columns of memory cells;
wherein the memory device is configured to receive an external address that addresses a non-defective column of memory cells of a sequence of columns of memory cells of the memory device in place of a defective column of memory cells of the sequence of columns of memory cells such that the non-defective column replaces the defective column, and wherein the non-defective column is a proximate non-defective column following the defective column in the sequence of columns that is available to replace the defective column.

14. The memory device of claim 13, wherein the memory device includes a defective address register configured to store an address of the defective column.

15. The memory device of claim 14, wherein the memory device is configured to output the address of the defective column to a controller at least partially in response to the memory device powering up.

16. The memory device of claim 14, further comprising control logic configured to send a signal to the defective column address register in response to determining that memory device is powered up, wherein the memory device is configured to output the address of the defective column to a controller in response to receiving the signal from the control logic.

17. The memory device of claim 13, wherein the memory device is configured to apply a voltage correction to the non-defective column of memory cells that replaces the defective column of memory cells in response to receiving an external signal.

18. A memory device, comprising:
columns of memory cells;
wherein the memory device is configured to:
send an address of a defective column of memory cells to a controller; and
receive, from the controller, an address of a non-defective column of memory cells for addressing the non-defective column of memory cells in place of the defective column of memory cells.

19. The memory device of claim 18, wherein the non-defective column of memory cells is a first available non-defective column of memory cells within a sequence of the columns of memory cells, wherein the memory device is configured to receive, from the controller, an address of a next available non-defective column of memory cells within the sequence of columns of memory cells for addressing the next available non-defective column of memory cells in place of the first available non-defective column of memory cells.

20. The memory device of claim 19, wherein the defective column of memory cells and the first available non-defective column of memory cells are located in a primary memory array of the memory device and the next available non-defective column of memory cells is located in a redundant memory array of the memory device.

* * * * *